(12) United States Patent
Morimoto et al.

(10) Patent No.: US 12,106,792 B2
(45) Date of Patent: Oct. 1, 2024

(54) APPARATUSES AND METHODS FOR PARTIAL ARRAY SELF REFRESH MASKING

(71) Applicant: MICRON TECHNOLOGY, INC., Boise, ID (US)

(72) Inventors: Yukimi Morimoto, Kanagawa (JP); Yoshio Mizukane, Kanagawa (JP); Hidekazu Noguchi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 267 days.

(21) Appl. No.: 17/829,096

(22) Filed: May 31, 2022

(65) Prior Publication Data

US 2023/0410874 A1 Dec. 21, 2023

(51) Int. Cl.
*G11C 7/22* (2006.01)
*G11C 11/406* (2006.01)

(52) U.S. Cl.
CPC .. *G11C 11/40615* (2013.01); *G11C 11/40622* (2013.01); *G11C 7/22* (2013.01)

(58) Field of Classification Search
CPC ........ G11C 7/1051; G11C 7/1078; G11C 7/22
See application file for complete search history.

(56) References Cited

U.S. PATENT DOCUMENTS 5,299,159 A * 3/1994 Balistreri ............. G11C 7/1075
365/189.04

* cited by examiner

*Primary Examiner* — Jason Lappas
(74) *Attorney, Agent, or Firm* — Dorsey & Whitney LLP

(57) ABSTRACT

Apparatuses, systems, and methods for partial array self refresh masking. A memory bank may be divided into a number of segments, each of which is associated with partial-array self-refresh (PASR) logic which provides a mask signal. The mask signal may be deactivated responsive to an access operation performed on the associated segment. While the mask signal is deactivated, self-refresh operations are performed on the segment. A period of time after deactivating the mask signal, the mask signal may be reactivated.

13 Claims, 6 Drawing Sheets

APPARATUSES AND METHODS FOR PARTIAL ARRAY SELF REFRESH MASKING

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). When accessed, the memory cell may be coupled to a digit line (or bit line), and a voltage on the digit line may change based on the information stored in the coupled memory cell.

In volatile memory devices, the information may decay over time. To prevent information from being lost, the information may be periodically refreshed (e.g., by restoring the charge on a memory cell to an initial level). However, refresh operations which are performed unnecessarily may increase the power draw of the memory.

DETAILED DESCRIPTION

Figure 1:
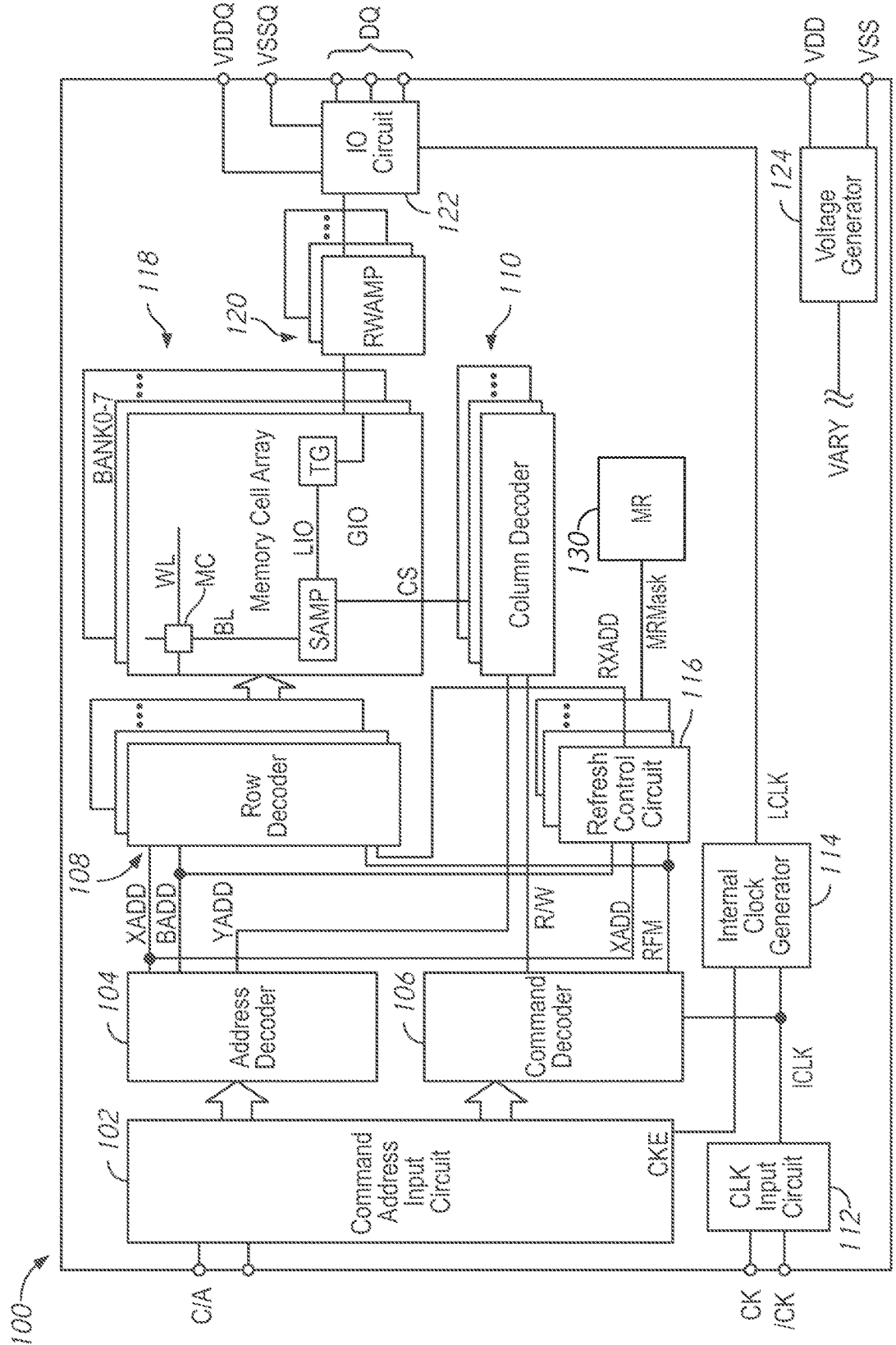
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory arrays may generally include a number of memory cells arranged at the intersection of word lines (rows) and bit lines/digit lines (columns). To prevent information from being lost, the memory may refresh memory cells on a row-by-row basis (or in sets of rows). Over the course a refresh cycle, the memory may refresh the memory cells along each of the wordlines. For example, as part of sequential refresh operations, such as CAS before RAS (CBR) refresh operations, the memory may refresh the memory array on a wordline by wordline basis, 'counting' through a sequence of word lines over the course of a refresh cycle.

The memory may receive refresh commands from a controller and perform refresh operations responsive to that refresh command. The memory may also enter a self-refresh mode, where the memory generates a refresh signal based on internal timing (e.g., an oscillator) and refreshes the memory with timing based on the self-refresh signal (e.g., by performing one or more refresh operations with each activation of the self-refresh signal). However, it may not be necessary to refresh certain sections of the memory array, for example if no data is currently stored in that section of the array. It may be useful to mask self-refresh operations in segments of the memory which are not in use, for example in order to save power. The memory may have a partial array self-refresh (PASR) feature, where different segments of the array may be separately self-refreshed. For example, a mode register setting may be used to disable self-refreshes in a segment of the memory by masking the self-refresh signal. However, problems may arise, for example if information is stored in a segment where self-refresh is masked, then that information may be lost if it is not refreshed. Similarly, if the self-refresh is not masked in a segment where no data is stored, then power is wasted needlessly refreshing those memory cells. There may be a need to monitor accesses to the different segments to determine the masking state of PASR operations.

The present disclosure is drawn to apparatuses, systems, and methods for PASR masking. Each memory bank may be divided into segments. Each segment may have associated PASR logic which may determine if that segment is currently masked or not based on a mode register setting associated with that segment and how recently an activation signal was received. If a self-refresh signal is received while the segment is masked, the segment will not perform a self-refresh operation. If the mode register indicates that the segment is not masked but an activation signal (indicating an access operation) is not received by the PASR logic for a period of time, then masking may be turned on for that segment. If an activation signal is received while the mode register indicates masking is on, then the PASR logic may turn off masking for that segment. In this manner, the masking of a given segment may depend on whether an access to that segment was recently performed or not as well as on the mode register setting. The PASR logic may synchronize changing to the masking signal to a refresh signal, so that the masking state is not changed during refresh operations.

For example, the PASR logic may include a masking activation circuit which activates a mask signal even when a PASR masking mode register is not set. The masking activation circuit may generally provide a mask signal at a low level (e.g., to indicate that the segment is not masked and that self-refresh operations should be performed) since that is what the mode register indicates. However, the masking activation circuit may count an amount of time (e.g., based on a number of activations of a self-refresh oscillator signal) since a most recent access to the associated segment. When that amount of time reaches a threshold, the masking activation circuit may begin providing the mask signal at an active level, even though the mode register may still indicate no masking.

Similarly, the PASR logic may include a masking deactivation circuit which deactivates a mask signal even when a PASR masking mode register is set. The masking deactivation circuit may generally provide a mask signal at an active level since that is what the mode register indicates. The masking deactivation circuit may count time in a similar manner to the masking activation circuit and may provide the mask signal at an inactive level for an amount of time after receiving an access to the associated segment.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. As explained in more detail herein, each bank may be further divided into two or more segments. The segments may represent a physical and/or logical sub-division of the memory bank. For example, the segments may represent a logical sub-division of the memory bank 118, where each segment represents a group of memory cells which share a common address value.

Each memory segment includes a plurality of word lines WL, a plurality of bit lines BL, and a plurality of memory cells MC arranged at intersections of the plurality of word lines WL and the plurality of bit lines BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. In some embodiments, the row decoder 108 may determine which segment of the memory bank 118 is activated (e.g., based on a row address).

The bit lines BL are coupled to a respective sense amplifier (SAMP). Read data from the bit line BL is amplified by the sense amplifier SAMP, and transferred to read/write amplifiers 120 over local data lines (LIO), transfer gate (TG), and global data lines (GIO). Conversely, write data outputted from the read/write amplifiers 120 is transferred to the sense amplifier SAMP over the complementary main data lines GIO, the transfer gate TG, and the complementary local data lines LIO, and written in the memory cell MC coupled to the bit line BL.

The semiconductor device 100 may employ a plurality of external terminals, such as solder pads, that include command and address (C/A) terminals coupled to a command and address bus to receive commands and addresses, clock terminals to receive clocks CK and /CK, data terminals coupled to a data bus to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The column decoder 110 may provide a column select signal CS, which may activate a selected one of the sense amplifiers SAMP. The address decoder 104 may also supply a decoded bank address BADD, which may indicate the bank of the memory array 118 containing the decoded row address XADD and column address YADD. The row address XADD may indicate the sub-bank within the bank indicated by BADD.

The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is provided along the data bus and output to outside from the data terminals DQ via the input/output circuit 122.

The device 100 may receive an access command which is a write command. When the write command is received, and a bank address, a row address and a column address are timely supplied with the write command, write data supplied to the data terminals DQ is provided along the data bus and written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 includes refresh control circuits 116, each associated with a bank of the memory array 118. Each refresh control circuit 116 may determine when to perform a refresh operation on the associated sub-bank. The refresh control circuit 116 provides a refresh address RXADD (along with one or more refresh signals, not shown in FIG. 1). The row decoder 108 performs a refresh operation on one or more word lines associated with RXADD.

The refresh control circuit 116 may perform multiple types of refresh operation, which may determine how the address RXADD is generated, as well as other details such as how many word lines are associated with the address RXADD. For example, the refresh control circuit 116 may perform sequential refresh operations, where the refresh address RXADD is generated based on a sequence of refresh operations such as CBR refresh operations. For example, after a first sequential refresh operation with an address RXADD, the next sequential refresh operation may generate an address RXADD+1. Sequential refresh addresses may be associated with multiple word lines, for example by truncating the address RXADD compared to a full row address XADD, and refreshing all word lines which share the truncated portion in common. Over the course of a refresh cycle, the sequential refresh operations may refresh all word lines in the array (e.g., by sequentially generating addresses associated with all word lines) and then the sequence may recycle.

As well as sequential refresh operations, the refresh control circuit 116 may perform targeted refresh operations, where the refresh address RXADD is based on a detected aggressor word lines. Certain access patterns (e.g., row hammering) to a row may cause an increased rate of data decay in the memory cells of other nearby rows. It is useful to identify these aggressor rows so that their victims can be refreshed. The refresh control circuit may include logic which detects aggressors (e.g., when a number of accesses to a given row crosses a threshold) and then generates a refresh address RXADD based on the detected aggressor. For example, if the aggressor is AggXADD, then the refresh control circuit may refresh adjacent and/or nearby word lines such as one or more of AggXADD+1, AggXADD−1, AggXADD+2, AggXADD−2, etc. The targeted refresh operations may occur based on a number of sequential operations which have occurred. In some embodiments, targeted refresh operations may 'steal' a timeslot which would otherwise have been used for a sequential refresh operation. For example, every $N^{th}$ sequential refresh operation may be replaced with a targeted refresh operation instead.

The refresh control circuit 116 may perform refresh operations with timing based on various signals. For example, a controller of the memory may provide a refresh signal REF which may cause the refresh control circuit 116 to perform refresh operations. The refresh control circuit 116 may also perform refresh operations with internal timing in a self-refresh mode. For example, the memory device 100 may enter a self-refresh mode responsive to a self-refresh mode entry command During the self-refresh mode, the refresh control circuit 116 may perform refresh operations with timing based on an internal signal, such as a self-refresh signal. For example, the self-refresh signal may be an oscillator signal, and responsive to every rising edge of the self-refresh signal, a refresh operation may be called for. In some embodiments, the device 100 may automatically perform self-refresh operations under certain conditions (e.g., while the device 100 is in a standby mode).

The refresh control circuit 116 may determine if each segment of the bank should have its self-refresh operations masked or not. When the self-refresh operations are masked, when a self-refresh operation is called for, the refresh control circuit 116 may ignore the self-refresh signal and not perform a self-refresh operation. A mode register 130 may store self-refresh masking enable signals MRMask for each of the segments of the memory bank. As described in more detail herein, the refresh control circuit 116 may use the self-refresh masking enable signal from the mode register 130 as well as whether or not that segment was recently accessed to determine if the segment should be masked or not.

The refresh control circuit 116 may generate a masking signal for each segment. When the mask signal is active, the self-refresh operations for that segment are masked. When the mask signal is inactive, self-refresh operations are performed on that segment. Each segment may have an associate PASR circuit when sets a level of the mask signal for that segment based on the value MRMask in the mode register 130 and on whether an access was recently performed on that segment.

The power supply terminals are supplied with power supply potentials VDD and VSS. The power supply potentials VDD and VSS are supplied to an internal voltage generator circuit 124. The internal voltage generator circuit 124 generates various internal potentials VARY, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
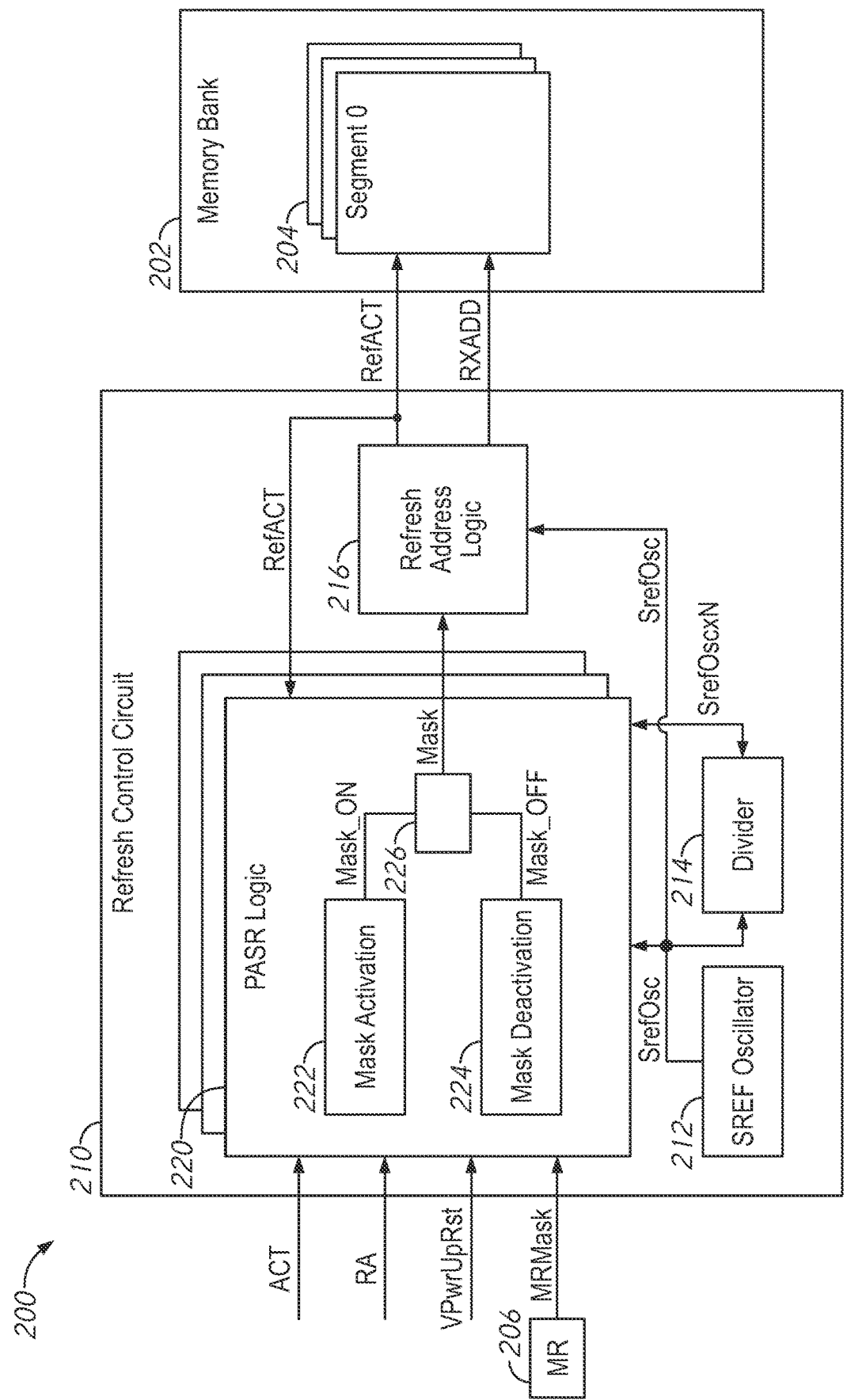
FIG. 2 is a block diagram of refresh logic according to some embodiments of the present disclosure.

FIG. 2 is a block diagram of refresh logic according to some embodiments of the present disclosure. The refresh logic 200 may, in some embodiments, represent portions of a memory device, such as the memory device 100 of FIG. 1. For the sake of clarity, certain components and/or signals not involved in self-refresh operations may be omitted from the view of FIG. 2. The refresh control circuit 210 of FIG. 2 may, in some embodiments, be an example implementation of the refresh control circuit 116 of FIG. 1.

The refresh logic 200 includes a refresh control circuit 210 which performs self-refresh operations on a memory bank 202. The memory bank includes a set of segments 204. Each segment 204 may share a value of a portion of a row address RA (e.g., XADD of FIG. 1) in common. For example, the row address bits RA<16:14> may represent a segment address which specifies one of the segments 204. Since in this example 3 bits specify a segment, there may be eight segments 204 (e.g., one of each unique value of RA<16:14>) per bank 202. The number of bits (as well as which bits) of the row address and the number of segments may vary in other example embodiments. Some components of the refresh control circuit 210, such as the PASR logic 220 may be repeated on a segment by segment basis, while some components such as the SREF oscillator 212 and divider 214 may be shared between segments.

The refresh control circuit 210 includes a self-refresh oscillator 212 which provides a self-refresh timing signal SrefOsc when the memory is in a self-refresh mode. A refresh address logic circuit 216 provides a refresh address RXADD with timing based off of SrefOsc. A refresh operation may be performed on the word lines in the segment 204 which are associated with RXADD, unless signal Mask for that segment is active. The mask signal Mask may indicate if the segment associated with the self-refresh operation is masked or not. There may be a mask signal Mask for each segment 204, A PASR logic circuit 220 may set the state of Mask for each segment based on a mode register 206 setting MRMask associated with that segment and a recent access history to the associated segment.

The PASR logic 220 includes mask activation logic 222 which activates the mask signal Mask even if the mode register MRMask is inactive, based on how recently an activation was received for the associated segment 204. The PASR logic 220 also includes mask deactivation logic 224 which deactivates the mask signal Mask for a period of time even if the mode register signal NRMask is active. Logic 226 may combine Mask_ON and Mask_OFF signals from the mask activation circuit 222 and deactivation circuits 224 respectively to produce the overall mask signal Mask for each of the segments 204. Although only one is shown in FIG. 2, there may be multiple signals Mask, one for each segment, and each segment 204 may have a masking state independent from the other segments of the bank 202.

The refresh control circuit 210 includes a self-refresh oscillator 212 which provides a self-refresh timing signal SrefOsc. The self-refresh oscillator 212 and signal SrefOsc may, in some embodiments, be shared by refresh logic associated with multiple segments. The signal SrefOsc may be a periodic signal which is active during a self-refresh mode. Each activation of SrefOsc (e.g., each rising edge or each falling edge) may call for a self-refresh operation and so the period of SrefOsc may determine a timing of self-refresh operations.

The refresh address logic 216 may generate a refresh address RXADD which indicates which word lines in each segment 204 should be refreshed. The refresh address RXADD may be truncated (e.g., to remove a portion which specifies a segment) and may specify a word line in each of the segments 204. The refresh address logic 216 also provides a refresh activation signal RefAct for each segment 204 responsive to each activation of SrefOsc when a signal Mask for that segment is inactive (e.g., at a low logical level). When the signal Mask is active (e.g., at a high logical level) the refresh address logic 216 may not provide the signal RefAct to that segment (but may still provide RefAct to other segments where the associated Mask signal is inactive). Responsive to the signal RefAct for a given segment, a row decoder (not shown in FIG. 2) may refresh the word line(s) indicated by RXADD.

Responsive to the signal SrefOsc, the refresh address logic 216 generates a refresh address RXADD. The refresh address may be part of a sequential refresh operation. For example, each time SrefOsc is received (while Mask is inactive), a refresh address RXADD may be generated by incrementing a previous refresh address. In some embodiments, the refresh address RXADD generated responsive to SrefOsc may be a targeted or row hammer refresh (RHR) address which is generated based on an identified aggressor word line.

The PASR logic 220 may determine the state of each of the signals Mask (and thus determine whether each segment 204 is masked or not). A mode register 206 (e.g., 130 of FIG. 1) may store a mode register mask signal MRMask for each segment 204. The signal MRMask may be active to indicate that a given segment should be masked during self-refresh operations. The values in the mode register 206 may be set based on a setting of the memory (e.g., a fuse setting) and/or may be set by a controller (e.g., via a mode register write command). The overall signal Mask for each segment 204 may be set based on a state of the signal MRMask for that segment as well as how recently a word line in that segment 204 was accessed.

The refresh control circuit 210 includes a divider circuit 214 which generates a signals SrefOscN which has a period based on the period of the signal SrefOsc. For example, the signal SrefOscN may have a period which is 4 times longer than the period SrefOsc. Other ratios, such as 2×3×, 5×, 6×, 8×, etc. may be used in other example embodiments. The timer signal SrefOscxN may determine a timing that the PASR logic 220 uses to measure time since a most recent activation signal ACT. For example, SrefOscxN may determine a masking interval. If the activation ACT occurs during the masking interval determined by SrefOscxN, then the mask state for the segment may change.

When the signal MRMask is not active, a mask activation circuit 222 of the PASR logic 220 determines a state of Mask by providing a mask activation signal Mask_ON. For example, the logic 226 may pass Mask_ON as Mask when MRMask is inactive. The mask activation circuit 222 receives an activation signal ACT from the command decoder (e.g., 106 of FIG. 1) along with a row address RA from an address decoder (e.g., 104 of FIG. 1) as part of an access operation. The row address RA may include one or more bits which specify a segment 204 of the memory bank 202. For example, if there are eight segments per bank, then 3 bits of RA may specify the segment. If the row address RA indicates the segment 204 that the PASR logic is associated with, then responsive to the activation signal the signal Mask_ON may be set to an inactive level (e.g., a low logical level). The mask activation circuit 222 may keep the signal Mask_ON at a low level for a period of time based on the timer signal SrefOscxN (assuming no further accesses are performed on the associated segment 204 in that time). For example, the signal Mask_ON may be switched back to an active level (and Mask may be switched to an active level) after a next activation of the timer signal SrefOscxN (e.g., after a next rising edge of SrefOscxN). In some embodiments, the mask activation circuit 222 may switch the signal Mask_ON back to an active level in synchronization with a signal RefAct, which indicates when refresh operations are being performed. This may prevent conflicts between changing a masking state of the segment while refresh operations are being performed.

When the signal MRMask is active, a mask deactivation circuit 224 of the PASR logic 220 determines a state of Mask by providing a mask deactivation signal Mask_OFF. For example, the logic 226 may pass Mask_OFF as Mask when MRMask is active. The mask deactivation circuit 224 receives the signals ACT and RA as part of an access operation. If the row address RA indicates the section that the PASR logic 220 is associated with, then responsive to the activation signal ACT the mask deactivation signal Mask_OFF may be set to an inactive level for at least a period of time based off of the timer signal SrefOscxN. For example, the signal Mask_OFF may return to an active level after a time next activation of the timer signal SrefOscxN. In some embodiments, the mask activation circuit 222 may switch the signal Mask_OFF to an active level in synchronization with a signal RefAct, which indicates when refresh operations are being performed. This may prevent conflicts between changing a masking state of the segment while refresh operations are being performed.

The logic 226 provides an overall signal Mask based on the signals Mask_ON and Mask_OFF. For example, when the mode register signal MRMask is inactive, the signal Mask_ON may be provided as Mask, but when the signal MRMask is active, the signal Mask_OFF may be provided as Mask. In some embodiments, the logic 226 may be a multiplexer.

Figure 3:
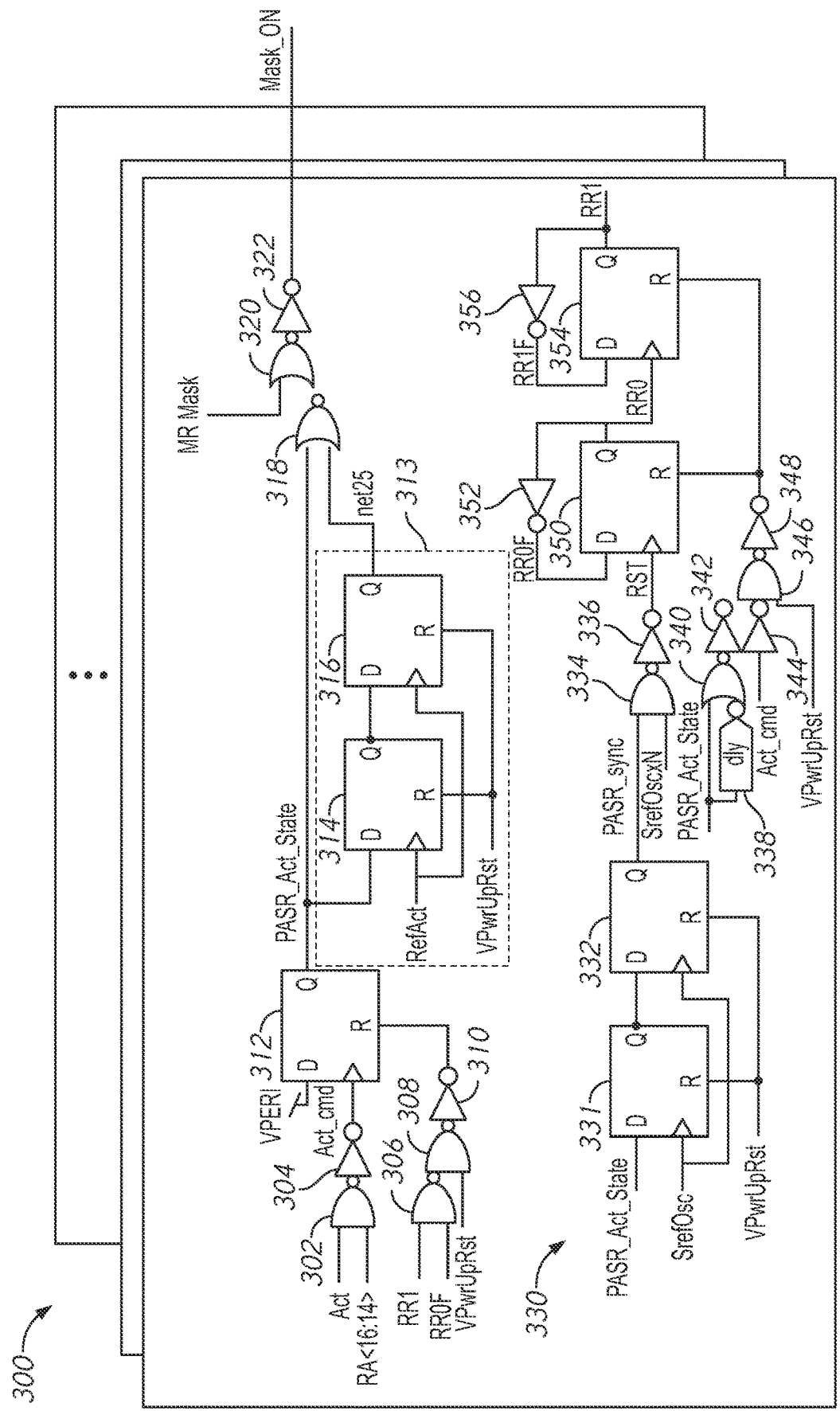
FIG. 3 is a schematic diagram of mask activation logic according to some embodiments of the present disclosure.
Figure 4:
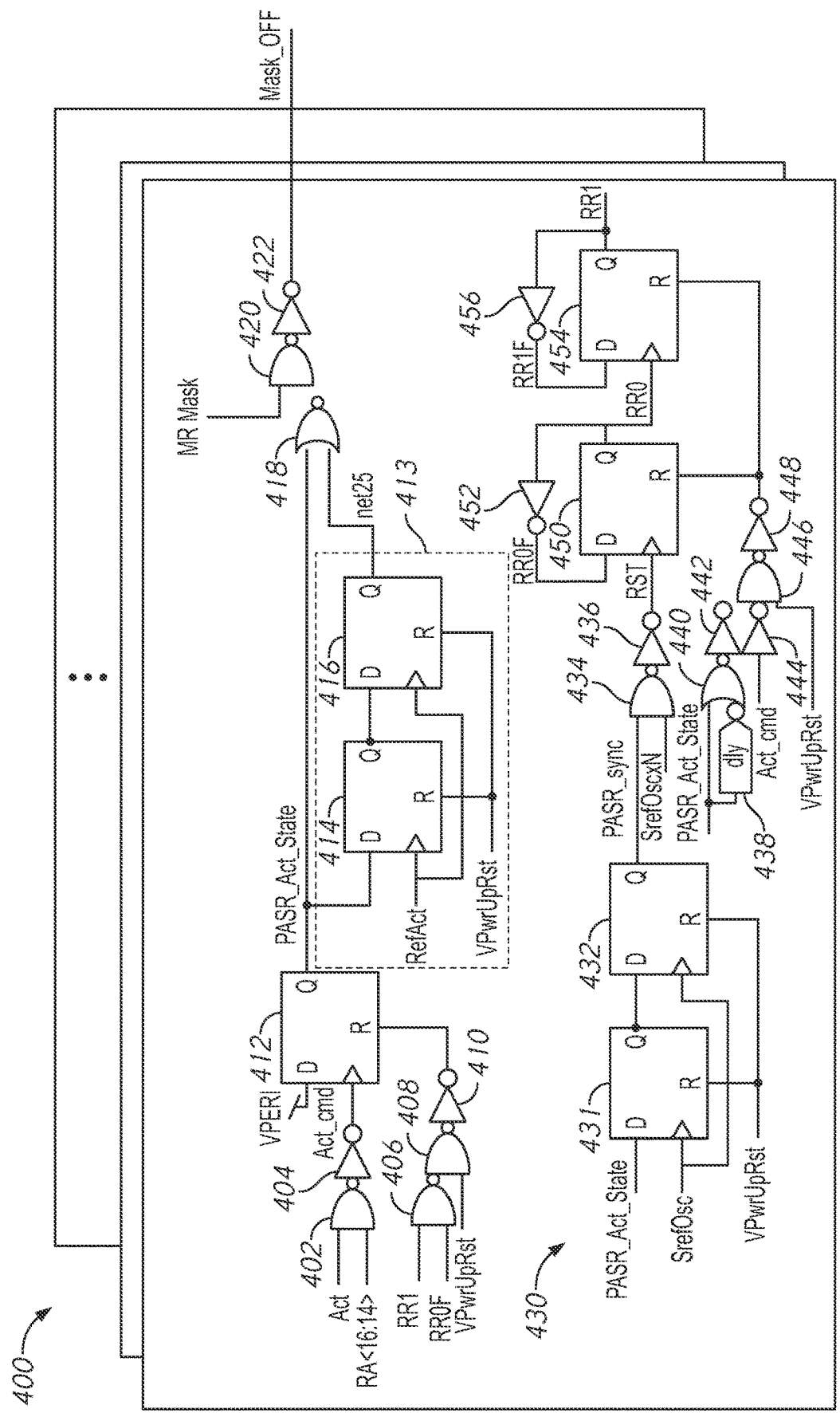
FIG. 4 is a schematic diagram of mask deactivation logic according to some embodiments of the present disclosure.

FIGS. 3 and 4 show example implementations of the mask activation logic (e.g., 222 of FIG. 2) and mask deactivation logic (e.g., 224 of FIG. 2) respectively. The circuits of FIGS. 3 and 4 may be generally similar to each other. In some embodiments one or more components may be shared between the two circuits. Both FIGS. 3 and 4 show various logic functions implemented in series with an inverter circuit. For example, AND logic may be implemented as a NAND gate in series with an inverter. However, it should be understood that there are many ways of implementing AND logic (e.g., using an AND gate) and that the present disclosure is not limited to the example implementations of FIGS. 3-4.

FIG. 3 is a schematic diagram of mask activation logic according to some embodiments of the present disclosure. The mask activation logic 300, may, in some embodiments, implement the mask activation logic of 222 of FIG. 2.

The mask activation logic 300 includes a first latch 312 which stores a PASR activation state PASR_Act_State. The first latch 312, as well as the latches 314, 316, 331, 332, 350, and 354 may be implemented as flip-flop (FF) circuits where a low logical level on the reset terminal causes a reset of the latch. Other types of latch may be used in other example embodiments. The PASR activation state PASR_Act_State is used to determine a state of the mask activation signal Mask_ON. The latch 312 sets PASR_Act_State to an active level (deactivating the mask signal Mask_ON) responsive to a row address RA which indicates the segment associated with the activation logic 300. Reset logic 330 counts a number of activations of a timer signal SrefOscxN since a synchronized state signal PASR_sync, which is based on when PASR_Act_State became active. In other words, the count may measure the amount of time since the last Act_cmd in terms of the SrefOscxN frequency. When the count value reaches a threshold, PASR_Act_State is reset, which changes the mask signal Mask_ON back to an active level.

The latch has a data terminal D coupled to a system voltage, such as VPERI, which represents a logical high, a clock terminal coupled to a segment access signal Act_cmd which is active when the current access is to the segment associated with the activation logic 300 and a reset terminal R which is coupled to reset signals RR1 and RR0F as described in more detail herein. A NAND gate 302 and inverter 304 form AND logic which provides the segment access signal Act_Cmd based on the signals Act and the row address bits (e.g., RA<16:14>) which specify the segment. When the row address indicates that segment address associated with the mask activation logic 300, and the activation signal Act indicates an access operation, the signal Act_cmd is at the active level. Responsive to the signal Act_cmd at an active level, the PASR activation state PASR_Act_State is set to VPERI (e.g., a logical high), until it is reset to a logical low by the signals RR1 and RR0F, which represent the count of the number of activations of SrefOscxN since PASR_Act_ State become active stored in the reset logic 330 (specifically, the most significate bit RR1 and inverse of the least significant bit RR0F of the count). A NAND gate 306 has inputs coupled to RR1 and RR0F. The output of the NAND gate 306 is coupled to an input of a NAND gate 308 in series with an inverter 310 which forms an AND logic. The NAND gate 308 has a second input terminal coupled to a power up/reset signal VPwrUpRst which is active when the memory is active and which is inactive during a power up or reset operation. Accordingly, the latch 312 resets PASR_Act_State to a low logical level when both RR1 and RR0F are at a high logical level (e.g., the count is 2) or when a power up/reset signal VPwrUpRst is inactive (e.g., indicating the memory is being reset).

The embodiment of FIG. 3 shows optional circuits 314-318 which synchronize a change in PASR_Act_State to a refresh activation signal RefAct, which indicates when refresh operations are being performed. The embodiment of FIG. 3 shows a synchronizer 313, including latches 314 and 316 which produce a synchronized signal net25, and a logic gate 318 which synchronizes changes in PASR_Act_State to net25. The synchronizer 313 includes a second latch 314 has an input D coupled to PASR_Act_State and an output Q coupled to an input D of a third latch 316 which outputs a synchronization signal net25. The latches 314 and 316 have clock terminals coupled in common to RefAct and reset terminals coupled to the power-up/reset signal VPwrUpRst. Accordingly, when PASR_Act_State changes state (e.g., from a low to a high logical level or vice versa) the signal net25 will change to the same state two activations of RefAct later, in synchronization with RefAct.

A NOR gate 318 has input terminals coupled to PASR_Act_State provided by an output terminal Q of the first latch 312 and to net25 provided by the output terminal Q of the third latch 316. Accordingly, an output of the NOR gate 318 is at a high logical level only when both PASR_Act_State and net25 are both at a low level. So if PASR_Act_State changes to a high logical level (e.g., because Act_Cmd is active), the output of the NOR gate 318 will go low. However, if PASR_Act_State changes to a low logical level (e.g., because the latch 312 is reset), the output of the NOR gate 318 will not go high until net25 goes low, in synchronization with RefAct.

The output of the NOR gate 318 is coupled to an input terminal of OR logic formed by a NOR gate 320 in series with an inverter 322. In embodiments where the synchronizer 313 is not used, the NOR gate 318 may be omitted, and the signal PASR_Act_State may be coupled to the input of NOR gate 320. The other input terminal of the NOR gate 320 is the mode register mask signal MRMask associated with the same segment as Act_cmd (e.g., the segment that the circuit 300 is associated with). The inverter 322 provides the signal Mask_ON. Accordingly, Mask_ON will be at a high logical level when MRMask is high (e.g., indicating masking is set by the mode register) or when the output of the NOR gate 318 is high (e.g., indicating that both PASR_Act_State and net25 are low). Since this is the mask activation logic 300 which functions to activate the mask signal when MRMask is at a low logical level, this means that if we assume MRMask is inactive, then Mask_ON will quickly drop to a low logical level as soon as Act_cmd becomes active, but when the state of PASR_Act_State is reset, the state of Mask_ON will return to a high level (e.g., masking PASR operations for the segment) in synchronization with RefAct (e.g., with the second RefAct after PASR_Act_State goes low).

The mask activation circuit 300 includes reset logic 330 (e.g., circuits 330-354) which provides the reset signals RR1 and RR0F based on an amount of time since the state of PASR_Act_State changed and the timer signal SrefOscxN provided by a divider (e.g., 214 of FIG. 2).

The reset logic 330 includes a fourth latch 331 and a fifth latch 332 that act as a second synchronizer for PASR_Act_State, this time to synchronize PASR_Act_State with SrefOsc. The fourth latch 331 has an input terminal coupled to PASR_Act_state and an output terminal coupled to an input of a fifth latch 332. The latches 331 and 332 have clock terminals coupled in common to SrefOsc and reset terminals coupled in common to VPwrUpRst. The output of the fifth latch 332 is a PASR synchronization signal PASR_sync. When PASR_Act_State changes state, the state of PASR_sync will also change at/after two activations of SrefOsc and in synchronization with SrefOsc. The signals PASR_sync and SrefOscxN are provided as inputs to AND logic formed of NAND gate 334 and inverter 336 which provides a signal RST. The signal RST will be at an active level when both PASR_sync and SrefOscxN are at an active level. The signal RST is provided to a clock terminal of a sixth latch 350.

The sixth latch 350 has a clock terminal coupled to RST, an output terminal which provides reset signal RR0 and an input terminal coupled to RR0F, which is the output of an inverter 352 coupled to RR0. A seventh latch 354 has a clock terminal coupled to RR0, an output which provides RR1, and an input coupled to RR1F, which is the output of an inverter 356 coupled to RR1. Accordingly, the latches 350 and 354 may act as a two bit counter with the values RR0 and RR1 as a least and most significant bit respectively, where (assuming both latch circuits 350 and 354 start from a reset state) after a first pulse of RST, RR0 changes from a low to a high, while RR1 remains low, after a second pulse of RST, RR0 may change to low while RR1 changes to high (making both RR1 and RR0F a logical high). The NAND gate 306 may reset the latch 312 when both RR1 and RR0F are at a logical high. In turn, the change in the state of PASR_Act_State may cause the reset of the latches 350 and 354, resetting the count.

The reset signals RR1 and RR0F may reset the latch 312 (setting the value of PASR_Act_State to an inactive level) when the count stored in the latches 350 and 354 reaches a threshold. In the embodiment of Figure 300, the threshold is determined by the behavior of the logic gates 306 and 308. In this example, the threshold is a count of two (e.g., when RR0F and RR1 are both a logical high). In other words, the latch 312 may be reset based on a second rising edge of SrefOscxN after PASR_sync goes high.

The latches 350 and 354 may be reset (thereby resetting the count value RR0 and RR1 to 00) by count reset logic which includes circuits 338-348. The signal PASR_Act_State is provided to a first input of OR logic which includes a NOR gate 340 coupled in series to an inverter 342. The other terminal of the NOR gate 340 is coupled through an inverting delay circuit to PASR_Act_State. Accordingly, the output of the inverter 342 will briefly go to a logical low whenever PASR_Act_State changes state for a time based on the length of the inverting delay 338 but the output will otherwise be high. The output of the inverter 342, along with VPwrUpRst and the output of an inverter 344 coupled to Act_cmd are all coupled to input terminals of AND logic which includes a NAND gate 346 and an inverter 348. Accordingly, if Act_cmd is low (e.g., the segment is not being accessed), and the output of the inverter 342 is high (e.g., PASR_Act_State has not recently changed levels), and the memory is not being reset or powered up (e.g., VPwrUpRst is high) then the counter latches 350 and 354 may not be reset. When Act_cmd becomes active, when PASR_Act_State has recently changed levels, or when the memory is reset, the count is reset (e.g., such that RR0 and RR1 are both low).

Accordingly, the reset logic 330 may manage a count (e.g., RR0 and RR1) which is reset when Act_cmd becomes active indicating an ACT command associated with the segment. This may begin measuring a period of time since the ACT command (e.g., measuring time in terms of a number of activations of SrefOscxN). The reset of the count to stop that measurement is set by the length of the delay circuit 338. The count may be increased starting two SrefOsc activations after PAS_Act_State becomes active (e.g., after an access to the segment occurs) each time a timing signal SrefOscxN is activated. When the count reaches a value of two (e.g., the MSB RR1 is 1 and the LSB RR0 is 0), the value PASR_Act_State in the latch 312 is reset.

In other words, when an access operation is provided to the segment, the mask activation signal Mask_ON will be set to a low logical level. If no other access operations on that segment are performed, then two pulses of SrefOscx later, the PASR activation state PASR_Act_State will be reset and responsive to that reset, Mask_ON will return to an active state in synchronization with RefAct.

FIG. 4 is a schematic diagram of mask deactivation logic according to some embodiments of the present disclosure. The mask deactivation logic 400 may, in some embodiments, implement the mask deactivation logic 224 of FIG. 2. The mask deactivation logic 400 may, in some embodiments, be broadly similar to the mask activation logic 300 of FIG. 3. In the example of FIG. 4, the mask deactivation logic 400 is the same as the mask activation logic 300 of FIG. 3, except that in the mask deactivation logic 400, a NAND gate 420 is used (instead of NOR gate 320 of FIG. 3). Components of FIG. 4 are labelled 402, 404, etc. and are analogous to corresponding features 302, 304, etc. of FIG. 3. For the sake of brevity, features, signals, and components already described with respect to FIG. 3 will not be repeated again with respect to FIG. 4.

The mask deactivation circuit 400 includes an AND logic implemented as a NAND gate 420 coupled in series with an inverter 422. The NAND gate 420 has a first input coupled to MRMask and a second terminal coupled to the output of NOR gate 418. Since the mask deactivation circuit 400 works to provide a mask deactivation signal Mask_OFF which sets a masking state when masking is turned on in the mode register, MRMask may be assumed to be a logical high. Accordingly, the signal Mask_OFF will be high when the output of the NOR gate 418 is a logical high (e.g., indicating that both PASR_Act_State and net25 are low), and low otherwise. Since this is the mask deactivation logic 400 which functions to control the mask signal when MRMask is at a high logical level, this means that if we assume MRMask is active, then Mask_OFF will quickly drop to a low logical level as soon as Act_cmd becomes active, but when the state of PASR_Act_State is reset, the state of Mask_ON will return to a high level (e.g., masking PASR operations for the segment) in synchronization with RefAct (e.g., with the second RefAct after PASR_Act_State goes low). If MRMask is inactive, then the output Mask_OFF will remain low (although the signal Mask_ON may be used to control the overall signal MASK in that case).

In other words, when an access operation is provided to the segment, the mask activation signal Mask_OFF will be set to a low logical level. If no other access operations on that segment are performed, then two pulses of the timer signal SrefOscxN later, the PASR activation state PASR_Act_State will be reset and responsive to that reset, Mask_OFF will return to an active state in synchronization with RefAct.

Figure 5:
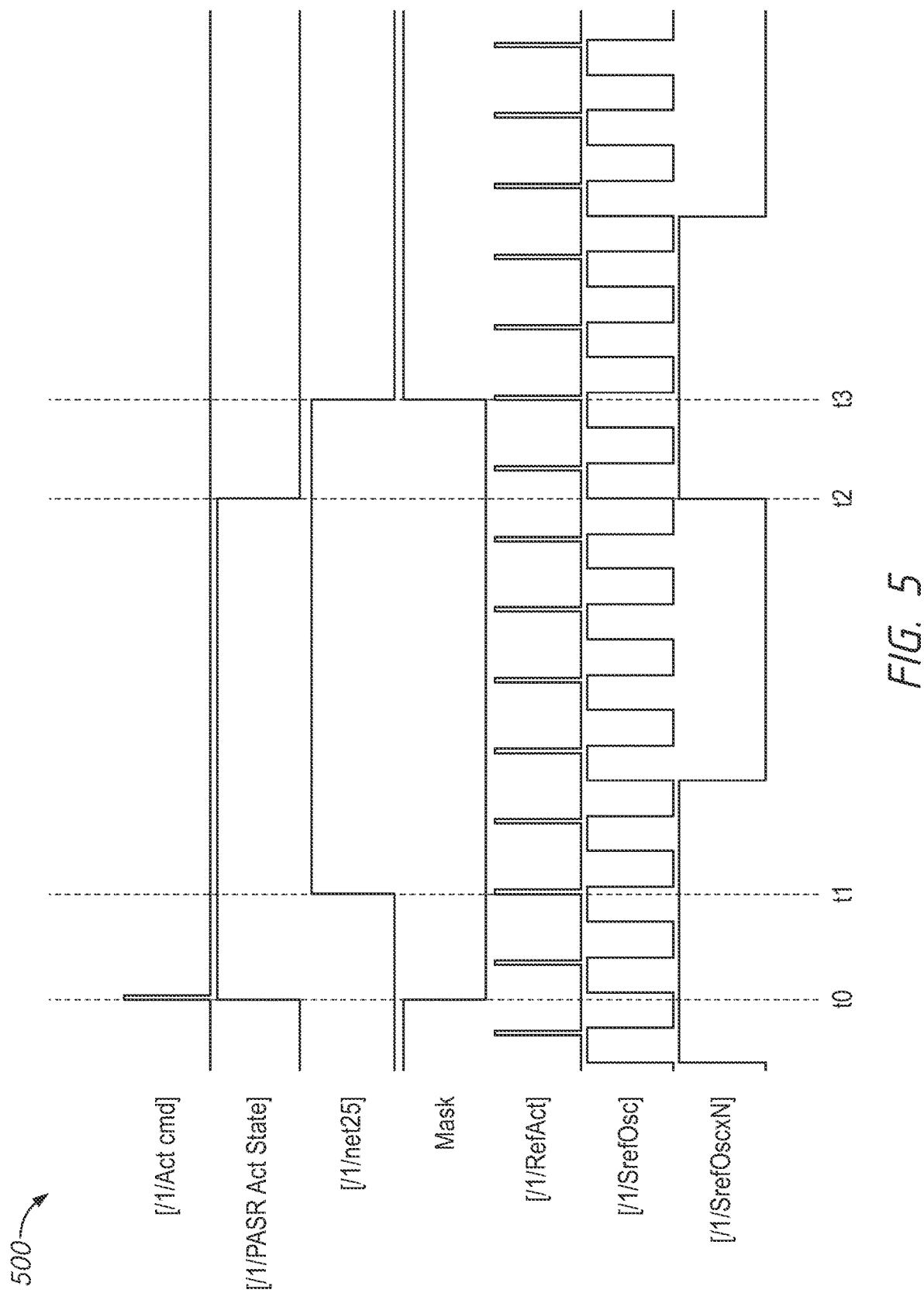
FIG. 5 is a timing diagram of signals involved in PASR masking according to some embodiments of the present disclosure.

FIG. 5 is a timing diagram of signals involved in PASR masking according to some embodiments of the present disclosure. The timing diagram may, in some embodiments, represent an operation of one or more apparatuses or systems described herein, such as the circuits of FIGS. 1-4. For example, the timing diagram 500 may represent signals in the logic 200 of FIG. 2. In describing FIG. 5, reference is made to some of the example circuits of FIG. 3, however it should be understood that similar behaviors may be ascribed to the circuit 400 of FIG. 4.

The timing diagram 500 begins at an initial time t0 when the segment associated with this refresh logic is received. Accordingly, the signal Act_cmd may activate at t0 (e.g., change to a high logical level). In turn, this may cause the signal PASR_ACT_State to rise to a logical level (e.g., because the latch 312 stores a value VPERI). The change of PASR_Act_State to a high logical level causes the signal Mask to fall to a low logical level (e.g., because the gate 318 outputs a logical low), which allows self refresh operations to be performed on the associate segment with timing based on SrefOsc. Since SrefOscxN happens to be at a high logical level at the time t0, a reset counter may store a value of 1 (since the change in state of PASR_Act_State as well as the activation of Act_cmd will prevent the count from being reset).

At a first time t1, a second activation of RefAct after PASR_Act_State changed levels, the signal net25 output from the synchronization circuit (e.g., latches 314 and 316) rises to the same state of PASR_Act_State in synchronization with SrefOsc.

At a second time t2, the signals SrefOscxN becomes active for a second time since the initial time t0. This may cause the reset count to rise to two, which in turn causes a reset signal to be provided to the latch (e.g., 312) which stores PASR_Act_State, returning it to a low logical level. However, the synchronization signal net25 may remain at a high logical level and so the signal Mask may remain at a low logical level. At a time t3, two RefActs after PASR_Act-State changed state (at t2), net25 may also fall to a low logical level, in synchronization with RefAct. Accordingly, at t3, the mask signal Mask may return to a high logical level, in synchronization with RefAct. After t3, further refresh operations may be masked in the segment.

Figure 6:
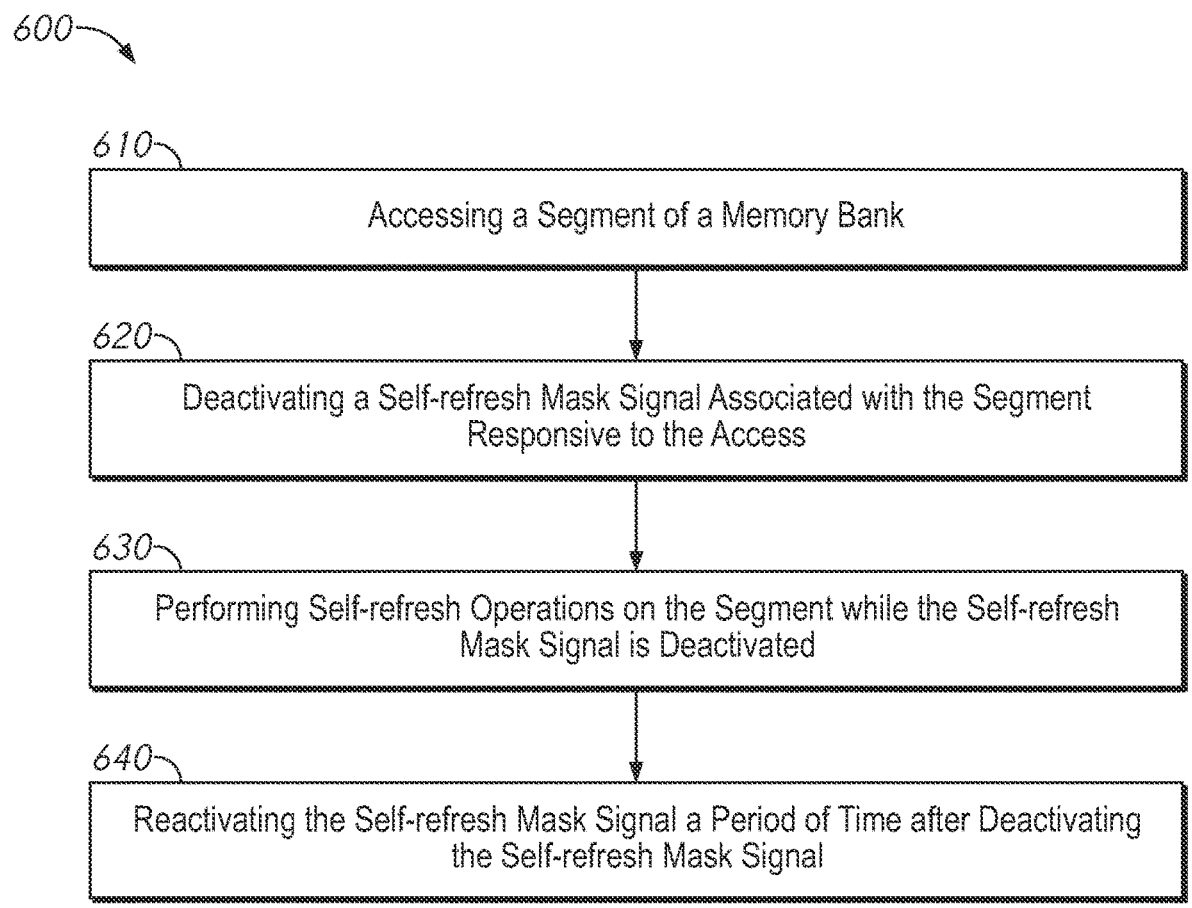
FIG. 6 is a flow chart of a method according to some embodiments of the present disclosure.

FIG. 6 is a flow chart of a method according to some embodiments of the present disclosure. The method 600 may, in some embodiments, be implemented by one or more of the apparatuses and systems described herein. For example, the method 600 may, in some embodiments, be implemented by the refresh logic 200 of FIG. 2 and/or the PASR logic 400 of FIG. 4.

The method 600 includes box 610, which describes accessing a segment of a memory bank. For example, a CA bus of a memory device (e.g., 100 of FIG. 1) may receive an access command (e.g., a read or write command) along with row, column, and bank addresses. The row address may include a portion (e.g., RA<16:14>) which specifies one of a plurality of segments (e.g., 204 of FIG. 2) of the bank 202.

Box 610 may be followed by box 620, which describes deactivating a self-refresh mask signal associated with the segment responsive to the segment. The method 600 may include setting a PASR state signal (e.g., PASR_Act_State) to an active level responsive to the access. For example, the method may include determining if the row address is associated with the segment and storing an active value in a latch (e.g., 312 of FIG. 3) if the row address matches the segment. The method 600 may include setting a mask signal to an inactive level responsive to the PASR state signal being set to the active level.

Box 620 may be followed by box 630, which describes performing self-refresh operations on the segment while the self-refresh mask signal is deactivated. For example, the method 600 may include generating a periodic self-refresh signal with a self-refresh oscillator (e.g., 212 of FIG. 2) and generating a refresh address responsive to each activation (e.g., each rising edge) of the self-refresh signal with a refresh address generator (e.g., 216 of FIG. 2). The method 600 may also include providing a refresh activation signal to each segment where the associate self-refresh mask signal is deactivated and not providing the refresh activation signal to each segment where the associated self-refresh mask signal is active. The method 600 may include performing a refresh operation on the wordline(s) in each segment which receives a refresh activation signal.

Block 630 may generally be followed by block 640 which describes reactivating the self-refresh mask signal a period of time after deactivating the self-refresh mask signal. For example, the method 600 may include resetting the PASR state signal to an inactive level after the period of time has elapsed (if no other accesses to the segment are performed during the period of time) and setting the mask signal to an active level responsive to the PASR state signal falling to the inactive level. In some embodiments, the method 600 may include synchronizing the timing of deactivating the mask signal to the refresh activation signal.

In some embodiments, the method 600 may include generating a timer signal (e.g., SrefOscxN). The method 600 may include dividing the periodic self-refresh signal (e.g., with divider circuit 214 of FIG. 2) to generate the timer signal. The method 600 may include synchronizing the PASR state signal to the self-refresh signal to generate a synchronized PASR state signal. The method may include counting a number of activations (e.g., rising edges) of the timer signal while the synchronized PASR state signal is active. The method 600 may include resetting the PASR state signal (e.g., by resetting latch 312 of FIG. 3) when the count value reaches a threshold. The method may include resetting the count value when the PASR state signal resets, or when an access to the segment is performed.

In some embodiments, the method 600 may include setting a state of the mask signal with mask activation logic (e.g., 300 of FIG. 3) when a PASR mode register is disabled and setting a state of the mask signal with mask deactivation logic (e.g., 400 of FIG. 4) when the PASR mode register is enabled.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A method comprising:
accessing a segment of a memory bank;
deactivating a self-refresh mask signal associated with the segment responsive to the access;
performing self-refresh operations on the segment while the self-refresh mask signal is deactivated; and
reactivating the self-refresh mask signal a period of time after deactivating the self-refresh mask signal.

2. The method of claim 1, further comprising:
generating a periodic self-refresh clock signal; and
performing self-refresh operations on the segment with timing based on self-refresh clock signal.

3. The method of claim 2, further comprising:
dividing the self-refresh clock signal; and
determining the period of time based, in part, on the divided self-refresh clock signal.

4. The method of claim 1, further comprising:
setting the self-refresh mask signal based on a mask activation logic circuit when a mask mode register signal is inactive; and
setting the self-refresh mask signal based on a mask deactivation logic circuit when the mask mode register signal is active.

5. The method of claim 1, further comprising synchronizing the reactivation of the self-refresh mask signal to a refresh activation signal.

6. The method of claim 1, further comprising:
receiving a row address as part of accessing the segment; and
deactivating the self-refresh mask signal based on a portion of the row address matching a value associated with the segment.

7. The method of claim 1, further comprising:
counting a number of activations of a timer signal after deactivating the self-refresh mask signal; and
reactivating the self-refresh mask signal after the count reaches a threshold.

8. An apparatus comprising:
a memory bank including a plurality of segments;
a self-refresh oscillator circuit configured to provide a periodic self-refresh signal; and
a plurality of partial array sub-refresh (PASR) logic circuits each associated with a respective one of the plurality of segments, each of the PASR logic circuits configured to provide one of a plurality of mask signals associated with the respective one of the plurality of segments, wherein each of the PASR logic circuit is configured to
deactivate the one of the plurality of mask signals responsive to an access operation on the respective one of the plurality of segments, and
reactivate the one of the plurality of mask signals a period of time after deactivating the one of the plurality of mask signals,
wherein self-refresh operations are performed on the respective one of the plurality of segments responsive to the self-refresh signal when the associated one of the plurality of mask signals is deactivated.

9. The apparatus of claim 8, further comprising a divider circuit configured to produce a timer signal based on the self-refresh signal, wherein each of the PASR logic circuits is configured to determine the period of time based on the timer signal.

10. The apparatus of claim 9, wherein each of the plurality of PASR logic circuits comprises a counter circuit configured to count a number of activations of the timer signal after deactivating the one of the plurality of mask signals, wherein each of the plurality of PASR logic circuits is configured to reactivate the one of the plurality of mask signals when the count reaches a threshold.

11. The apparatus of claim 8, further comprising a refresh address logic circuit configured to provide a refresh address and a plurality of refresh activation signals responsive to the self-refresh signal, wherein each of the plurality of refresh activation signals is associated with a respective one of the plurality of segments and one of the plurality of mask signals, and wherein refresh address logic circuit is configured to not provide selected ones of the plurality of refresh activation signals if the associated one of the plurality of mask signals is deactivated.

12. The apparatus of claim 11, wherein each of the plurality of PASR logic circuits further comprises a synchronizer configured to synchronize reactivating the one of the plurality of mask signals to the associated one of the refresh activation signals.

13. The apparatus of claim 8, wherein each of the plurality of PASR logic circuits comprises an activation logic circuit configured to set the one of the plurality of mask signals when a mode register is inactive and a deactivation logic circuit configured to set the one of the plurality of mask signals when the mode register is active.

* * * * *